United States Patent

[11] 3,590,478

[72] Inventor Yoshito Takehana
Tokyo, Japan
[21] Appl No. 730,412
[22] Filed May 20, 1968
[45] Patented July 6, 1971
[73] Assignee Sony Corporation
Tokyo, Japan

[54] METHOD OF FORMING ELECTRICAL LEADS FOR SEMICONDUCTOR DEVICE
8 Claims, 13 Drawing Figs.

[52] U.S. Cl. .......... 29/578, 29/626, 29/583
[51] Int. Cl. .......... B01j 17/00, H01l 5/00
[50] Field of Search .......... 29/583, 589, 590, 578

[56] References Cited
UNITED STATES PATENTS
3,200,468 8/1965 Dahlberg .......... 29/589
3,237,281 3/1966 Antonson .......... 29/583 X
3,288,662 11/1966 Weisberg .......... 29/590 UX

*Primary Examiner* – John F Campbell
*Assistant Examiner* – W Tupman
*Attorney*—Hill, Sherman, Meroni, Gross and Simpson

ABSTRACT: In the method of forming electrical leads for a semiconductor device, an insulating layer is formed on the area of a semiconductor substrate except at the electrode portion of each semiconductor element, and a parting or releasing agent is then coated over the insulating layer and electrical leads for the said respective elements are then fixed to the substrate in the positions where they extend over the semiconductor substrate of another or other elements. The semiconductor substrate is then divided into respective semiconductor elements and as a result, a semiconductor device, in which electrical leads are projecting outwardly from the circumference of the semiconductor element to which the leads are fixed, is provided.

INVENTOR.
YOSHITO TAKEHANA

BY Hill, Sherman, Meroni, Gross & Simpson ATTORNEYS

INVENTOR.
YOSHITO TAKEHANA

BY Hill, Sherman, Meroni, Gross & Simpson ATTORNEYS

INVENTOR.
YOSHITO TAKEHANA

BY Hill, Sherman, Meroni, Gross & Simpson ATTORNEYS

METHOD OF FORMING ELECTRICAL LEADS FOR SEMICONDUCTOR DEVICE

BACKGROUND OF THE INVENTION

1. Field of the Invention

This invention relates to a method of forming electrical leads for a semiconductor device, and more particularly to a method of effectively forming a plurality of semiconductor elements having relatively long leads in a semiconductor substrate.

2. Description of the Prior Art

In order to form electrical leads of each semiconductor element on a semiconductor substrate on which the semiconductor elements are constituted, in the conventional method an additional section of the semiconductor substrate is provided between the respective semiconductor elements so that the electrical leads do not project outside the circumference of each corresponding semiconductor element, i.e., up to the adjacent element, and one end of the electrical leads contacts the electrode of the semiconductor element and the other end of the electrical leads is placed in the additionally provided section. This leads to the wasteful and uneconomical use of the semiconductor substrate due to the additional section, and furthermore, the additional section has to be lengthened correspondingly as the electrical leads are lengthened, whereby increasing the wastefully used section of the semiconductor. Therefore, it is impossible to lengthen the leads a great extent.

SUMMARY OF THE INVENTION

A main object of this invention is to provide a method by which electrical leads with required length can be formed without wastefully using a semiconductor substrate for the formation of the electrical leads.

Another object of this invention is to provide a method by which the electrical leads, projecting along the outside of the circumference of the semiconductor element, can be simply formed.

A further object of this invention is to provide a method of forming the electrical leads which can increase the number of semiconductor elements obtainable from the unit area of the semiconductor substrate because, the semiconductor substrate is prevented from being wastefully used.

Still another object of this invention is to provide a method by which it is possible to form long electrical leads.

An additional object of this invention is to provide a method of forming electrical leads for semiconductor elements which require no headers.

A still further object of this invention is to provide a method of forming electrical leads adapted to enable semiconductor devices such as diodes, transistors, integrated circuits, etc. to be simply produced.

The above, and other objects, features and advantages of this invention will be apparent from the following detailed description.

In accordance with a feature of this invention, first of all an insulating layer is formed on a semiconductor substrate with which more than one semiconductor elements are formed. The insulating layer is not formed over the whole area of the substrate, but on the area except that part necessary for installation of electrical leads, i.e., part or all of the section on which the electrodes of the elements are formed, (which will be referred to as the electrode section in the subsequent description). In order to form the insulation, a layer of silicon oxide film or other material can be employed.

Then, a parting or releasing agent is coated over part or all of the insulating layer. In addition, the parting or releasing agent may be coated over the semiconductor substrate on which no insulating layer is formed, and the agent must be coated over the area excluding at least part or all of the section necessary for installation of the electrical leads, i.e., the electrode section of the element. The releasing agent is thus coated over the section onto which the electrical leads of the other elements are to extend in the next process. In other words, it will be sufficient if the parting or releasing agent prevents the electrical leads of an element from strongly adhering to the other elements. As the parting or releasing agent usable for this purpose, photo resist or other suitable substances may be employed.

Then, the electrical leads of each semiconductor element are fixed to the element by means of gilding, vacuum evaporation, etc., so that the electrode of an element contacts the electrode section of the corresponding adjacent element. Additionally one end of the lead is extended to another adjacent element, and the section extending to the other element is placed on the parting or releasing agent. The shape and size of the lead is optional, and its material may be made of a metal such as titanium, gold, etc.

Also, the semiconductor substrate is divided into respective semiconductor elements by means of scribing or etching. The electrical leads remain fixed to the corresponding element, but since the leads are disconnected from the other element, they are positioned so as to project outside the circumference of the corresponding element.

Further objects, features and advantages will be apparent from the following description and claims when read in view of the drawings.

DESCRIPTION OF THE PREFERRED EMBODIMENTS in FIG. 1 one example of the method according to this invention is illustrated in order of the process.

Figure 1C:
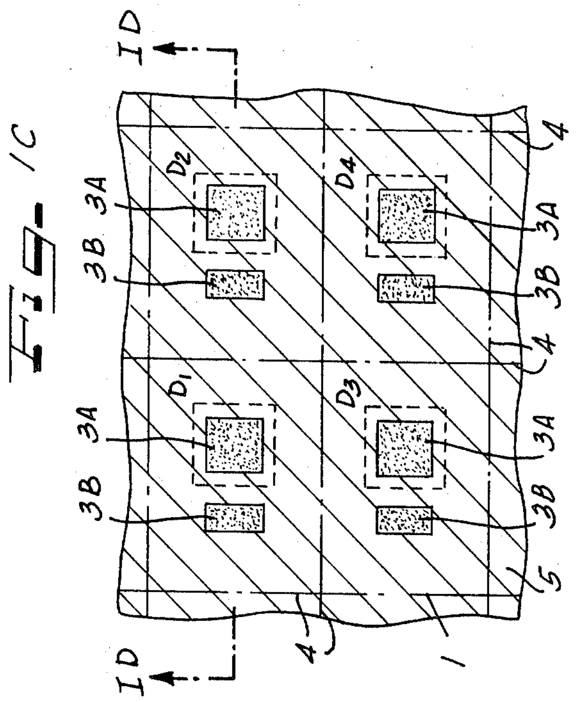
FIG. 1 illustrates one example of the method of this invention and FIGS. 1 A, C. E. G. and I are plan views, and FIGS. 1 B, D, F, H and J are sectional views.
Figure 1D:
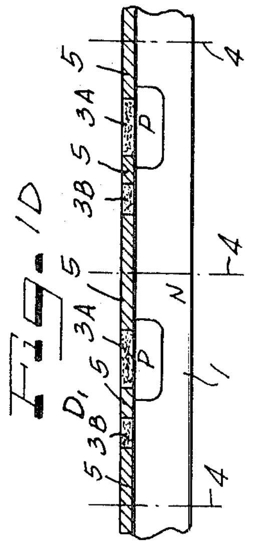
Figure 1A:
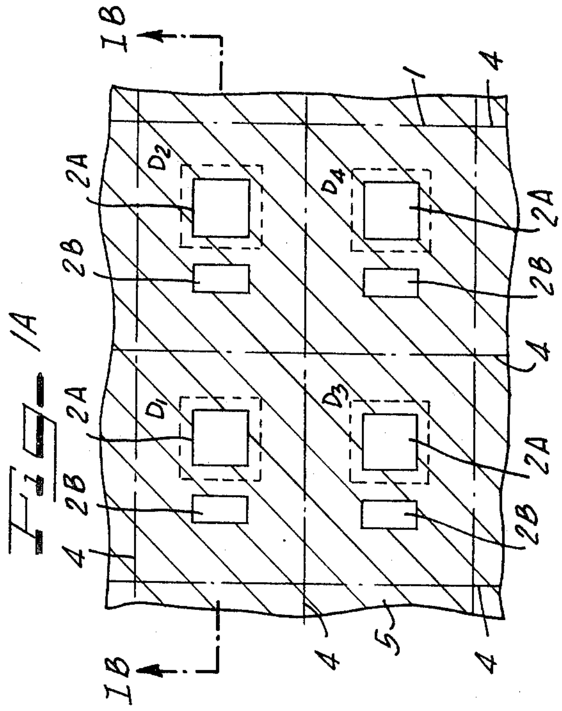
Figure 1B:
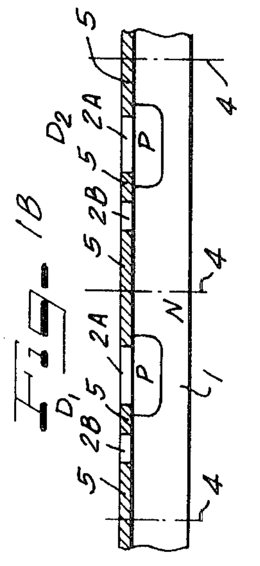

In FIGS. 1A and 1B, more than one semiconductor elements, such as diodes D1—D4 are formed in a semiconductor substrate or semiconductor wafer 1. To simultaneously form numerous similar elements on one sheet of the semiconductor wafer 1, the known "Planar" method is used. A silicon oxide film 5 is formed onto the wafer 1 in approximately equal thickness. Because this silicon oxide film 5 is formed over the area excluding the electrode section necessary for installation of electrical leads, holes 2A and 2B corresponding with the electrode section are produced. Imaginary border lines along which the semiconductor substrate will be divided in a subsequent stage of the process are indicated by dotted lines in the figures.

In the next step electrode material such as aluminum, which is to comprise ohmic electrodes, is vacuum-deposited in a thickness approximately the same as the silicon oxide film 5 inside the holes 2A and 2B, and this forms the electrodes 3A and 3B of respective elements D1—D4 as shown in FIGS. 1C and 1D. The formation of electrodes 3A and 3B can be made before or after an optional stage of the process. For example, it can be done after the adherence of the parting or releasing agent in the following stage of the process or before the formation of the silicon oxide film 5 in the preceding stage of the process.

Figure 1G:
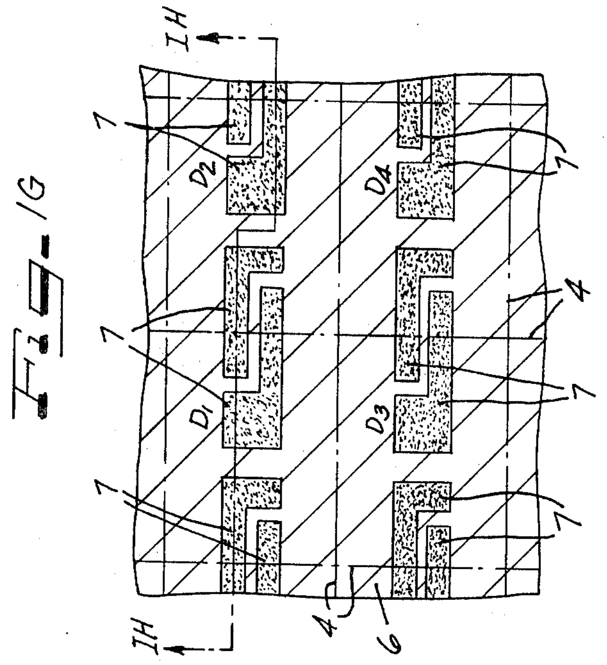
Figure 1H:
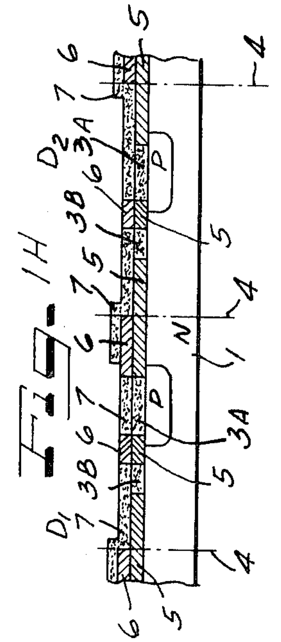
Figure 1E:
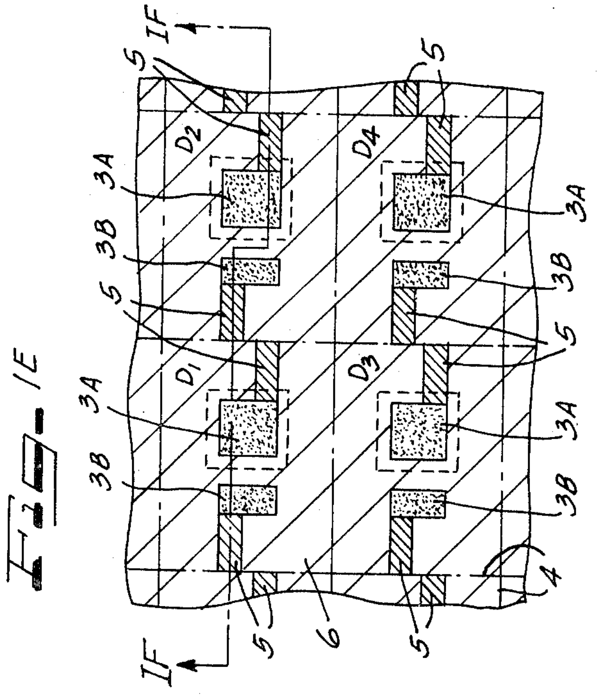
Figure 1F:
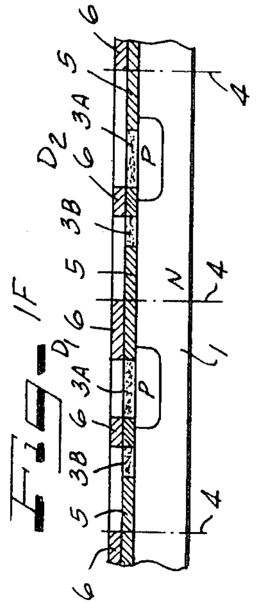

To the wafer 1 illustrated in FIGS. 1C and 1D, photo resist 6 as the parting or releasing agent is spread as shown in FIGS. 1E and 1F. The resist 6 has almost equal thickness over the area but electrodes 3A and 3B of the respective elements D1—D4, and the section ranging from these electrodes 3A and 3B to the imaginary border lines 4 of the elements D1—D4, which is the section to which the electrical leads 5 may be fixed are kept free of the resist 6.

On the wafer 1 as illustrated in FIGS. 1E AND 1F electrodes 7 are then formed, as shown in FIGS. 1G and 1H, with the relationship that one end contacts the electrodes 3A and 3B of the corresponding element and the other end extends to the other element. In this case, one end of the electrical lead 7 contacts the electrodes 3A and 3B, the inbetween section thereof contacts the oxide film 5 of the above mentioned section to which the electrical leads 7 are fixed, and the remaining portion contacts the parting or releasing agent 6 of the adjacent element. As a result, the electrical leads 7 are moved upwardly in the shape of a stair in the section where they cross the imaginary border lines 4 from the corresponding element to the other adjacent elements. That is to say, they are in the shape of a stair with a height equivalent to the thickness of the parting or releasing agent 6.

This makes it easy for these leads to be connected to other parts when the elements are subsequently employed as circuit elements. In addition, the material of the electrical leads 7 may be composed of metals such as titanium, gold, etc., and the leads are formed on the wafer 1 so that they are insulated from each other by means of gilding, vapor-deposition, etc., of the electrical conductive material. Although the leads 7 are tightly fixed to the electrodes 3A and 3B and the oxide film 5, they lightly adhere to the parting or releasing agent 6.

Figure 1I:
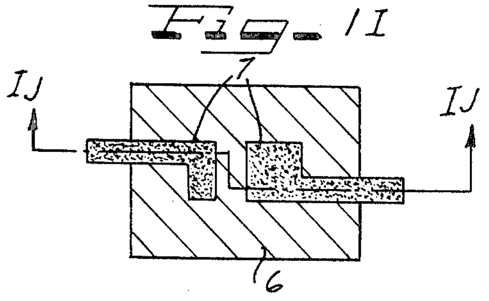
Figure 1J:
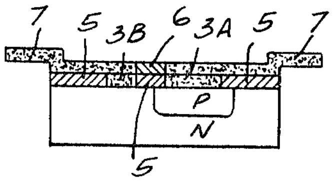

The wafer 1 shown in FIGS. 1G and 1H are then as illustrated in FIGS. 1I and 1J, divided along the imaginary border lines 4. Furthermore, the division is carried out by means of scribing, etching, etc., and the wafer 1 and the insulating layer 5 are thereby divided, but the electrical leads 7 remain on the element part which is contacting the electrodes 3A and 3B, and are thus disconnected from the other element. The reason for this is that although the leads 7 are tightly attached to the oxide film 5 of the corresponding element, they are disconnected from the parting or releasing agent 6 of the other element and adhere only to the corresponding element since they are contacting the other element through the parting or releasing agent 6. As a result, the leads 7 project outwardly from the circumference of their corresponding element.

Figure 2:
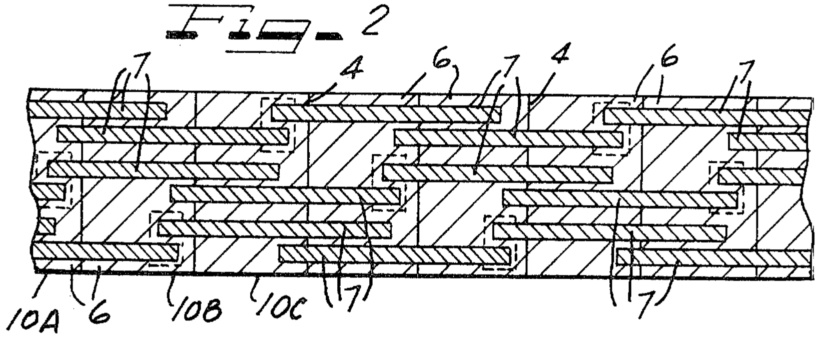
FIG. 2 is a plan view illustrating another example of the method according to this invention.

FIG. 2 illustrates another example of the method according to this invention. In FIG. 2, the electrical leads 7 of numerous semiconductor elements, e.g., diodes 10A, 10B, 10C, are longer than in the example of FIG. 1. That is to say, the leads 7 extend beyond the semiconductor substrate of the adjacent element and reach an element which is adjacent to the next one. However, the method of forming the leads is the same as that illustrated in FIG. 1, and therefore the sections equivalent to those of the example of FIG. 1, are designated by the same reference numerals.

Figure 3:
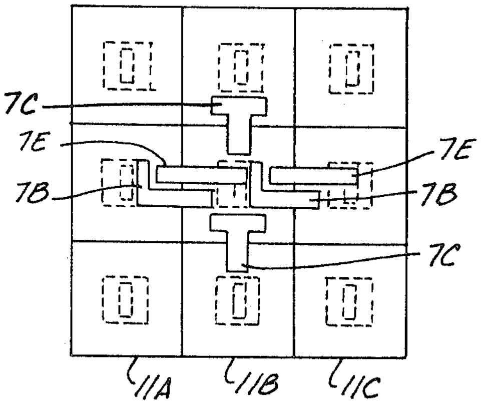
FIG. 3 is a plan view illustrating another example of the method according to this invention.

In FIG. 3 still another example of the method according to this invention is illustrated. In FIG. 3, semiconductor elements 11A, 11B, 11C, are transistors, and leads 7E are emitter electrodes, leads 7B are base electrodes and leads 7C are collector electrodes which extend at right angles to electrodes 7E and 7B. The method of forming the leads is the same as that of the example of FIG. 1.

Figure 4:
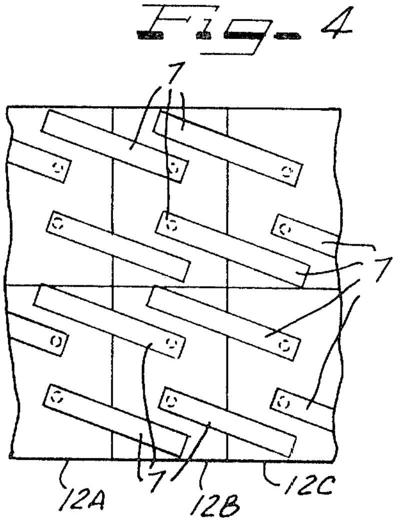
FIG. 4 is a plan view illustrating a further example of the method according to this invention.

FIG. 4 indicates a further example of the method according to this invention. In FIG. 4, respective semiconductor elements 12A, 12B, 12C, represent diodes, and respective leads extend in a diagonal direction in relation to the elements. The method of forming the leads is the same as that of the example shown in FIG. 1.

Although several specific embodiments of the invention have been described herein with reference to the accompanying drawings, it is to be understood that the invention is not limited to those specific embodiments and that various changes and modifications may be made therein by one skilled in the art without departing from the spirit or scope of the invention as set forth in the appended claims.

I claim:

1. A method of forming electrical leads for a semiconductor device comprising:
   a. forming an insulating layer on a semiconductor substrate having a plurality of semiconductor elements formed therein except over windows above the electrode section of each semiconductor element;
   b. depositing an electrical conductive layer in said windows;
   c. coating a releasing agent on said insulating layer except over said windows but leaving channels where no releasing agent is coated, said channels extending from said windows to an edge of said element;
   d. forming electrical leads for each semiconductor element on the said semiconductor substrate which extend from said electrical conductive layer in said windows over the insulating layer in said channels and over but terminating within the area of the releasing agent at the end of said channels which is positioned over the semiconductor substrate of an adjacent semiconductor element; and
   e. dividing the semiconductor substrate into respective semiconductor elements at least along lines corresponding to the ends of said channels except for the ends of said leads which extend over the semiconductor substrate of said adjacent semiconductor element.

2. The method of claim 1 wherein the electrical leads are insulated from each other.

3. The method of claim 1 wherein the electrical leads contact the electrodes of one element in such a manner that the leads extend over the semiconductor substrate of another element.

4. The method of claim 1 comprising making the electrical leads contact the electrodes of one element in such a manner that the leads extend over the semiconductor substrate of two other elements.

5. The method according to claim 1 comprising using photo resist as the releasing agent.

6. The method according to claim 1 in which the semiconductor element is a diode.

7. The method according to claim 1 in which the semiconductor element is a transistor.

8. The method according to claim 1 in which the electrode lead is fixed onto the semiconductor substrate obliquely relative to the semiconductor element.